United States Patent [19]
Chi et al.

[11] Patent Number: 5,101,243
[45] Date of Patent: Mar. 31, 1992

[54] SUPERCONDUCTING DEVICE STRUCTURES EMPLOYING ANISOTROPY OF THE MATERIAL ENERGY GAP

[75] Inventors: Cheng-Chung J. Chi, Yorktown Heights; Alan W. Kleinsasser, Putnam Valley, both of N.Y.

[73] Assignee: International Business Machines Corporation, Armonk, N.Y.

[21] Appl. No.: 526,402

[22] Filed: May 21, 1990

[51] Int. Cl.$^5$ .................. H01L 39/22; H01L 27/12; H01B 12/00; G11C 11/44

[52] U.S. Cl. .......................... 357/5; 357/4; 505/1; 505/702; 505/832; 505/874

[58] Field of Search ............. 357/5; 505/1, 702, 817, 505/874; 427/62

[56] References Cited

U.S. PATENT DOCUMENTS 4,831,421 5/1989 Gallagher et al. ............... 357/5

OTHER PUBLICATIONS

"Superconducting Properties of Thin Films of the High-Tc Perovskite Superconductors", Kapitulnik et al., Intl. J. Modern Phys B, vol. 1, #3 & 4, 1987, pp. 779-797.
"Anisotropic Properties of Superconducting Single-Crystal $(La_{1-x}Sr_x)CuO_4$", Hidaka et al., Jap. J. Appl. Phys., Apr. 4, 1987, pp. L377-L379.
"Anisotropic Copper Pairs in High-Tc Superconductors", Fusayoshi, Jap. J. Appl. Phys. vol. 26, #5, May 1987, pp. L652-L654.
"Effect of Oxygen Deficiency on the Crystal Structure and Superconducting Properties of the $Ba_2YCu_3O_y$", Kubo et al., Jap. J. Appl. Phys., vol. 26, #5, May 1987, pp. L768-L770.
"Prospects for Thin-Film Electronic Devices of High--Tc Superconductors", Braginski et al., 5th Int'l Workshop on Future Electron Devices-High-Temp. Superconducting Devices, Jun. 1988, pp. 171-179.
"Epitaxy and Orientation of $Eu_1Ba_2Cu_3O_{7-x}$ Films Grown In Situ by Magnetron Sputtering", J. Asano et al., Japanese Journal of Applied Physics, vol. 28, No. 6, Jun. 1989, pp. L981-L983.
"Superconducting Propeties of Aligned Crystalline Grains of $Y_1Ba_2Cu_3O_{7-}$" by D. E. Farrell et al., Physical Review B, vol. 36, No. 7, 1 Sep. 1987.
"Direct Observation of Electronic Anisotropy in Single-Crystal $Y_1Cu_3O_{7-x}$" by T. R. Dinger et al., Physical Review Letters, vol. 58, No. 25, 22 Jun. 1987.
"Anisotropic Nature of High-Temperature Superconductivity in Single-Crystal $Y_1Ba_2Cu_3O_{7-x}$" 7 Sep. 1987.

Primary Examiner—Rolf Hille
Assistant Examiner—Mahshid Saadat
Attorney, Agent, or Firm—Perman & Green

[57] ABSTRACT

A high $T_c$ oxide superconductive switching device [10] formed on a substantially planar substrate [18] includes a base electrode [12] comprised of a layer or film of anisotropic superconducting material. The layer has a first crystalline axis [c] along which a magnitude of an energy gap of the material is less than an energy gap of the material along other crystalline axes. The superconductive switching device further includes at least one injector electrode [14] forming a planar [16] or an edge tunneling junction with the base electrode for injecting, under the influence of a bias potential eV, quasiparticles into the base electrode. The first crystalline axis is aligned in a predetermined manner with the tunneling junction for optimizing a quasiparticle injection efficiency of the tunneling junction.

24 Claims, 2 Drawing Sheets

SUPERCONDUCTING DEVICE STRUCTURES EMPLOYING ANISOTROPY OF THE MATERIAL ENERGY GAP

FIELD OF THE INVENTION

This invention relates generally to electrical devices comprised of superconductive material and, in particular, to thin film devices in which superconductive films are driven substantially out of equilibrium and which operate in accordance with an energy gap anisotropy of the superconductors.

BACKGROUND OF THE INVENTION

In a superconducting film, the dissipationless current is carried by pairs of charge carriers. These pairs can decompose into quasiparticles, or single carrier excitations. The magnitude of the energy gap in a superconductor is determined by the density of quasiparticles. If a superconductor is perturbed, by raising its temperature, by external radiation, or by tunnel injection, the quasiparticle density increases, reducing the energy gap. Eventually the energy gap disappears and the current, now carried by normal carriers, is no longer dissipationless. As a result a voltage develops in the film. This phenomenon has been employed as the basis of a number of switching devices.

There is a class of superconductive devices in which a thin film of superconductive material is driven substantially out of equilibrium, causing a switching action. In one state the current is carried by superconducting pairs and there is no voltage across the film. In the other state, the current is carried by normal electrons and there is a voltage across the film. For proper choices of device and load resistances, the current in the superconductor in the latter state can be much smaller than in the former one, most of the current being switched to the load.

A non-equilibrium injection weak link device is described in commonly assigned U.S. Pat. No. 4,831,421, issued May 16, 1989, entitled "Superconducting Device" by W. J. Gallagher and S. I. Raider.

One difficulty which exists in all known devices of this type is the tendency of the injected excitations, or quasiparticles, to diffuse equally well in all crystal directions, due to the essentially isotropic nature of the superconductor's crystal structure. In the most promising device structures, this causes the volume of material which is perturbed to be larger than is desirable, with adverse effects on device gain and switching speed.

It has been observed that an energy gap of several high transition temperature ($T_c$) oxide superconductors, for example $La_{1-x}Sr_xCuO_4$ and $Y_1Ba_2Cu_3O_{7-x}$, exhibits significant anisotropy. This observation is at least partially supported by an experimentally-observed difference between energy gaps obtained by infrared transmission and by tunneling measurements, and by unusually large gaps seen in tunneling measurements in oriented films along a crystal direction in which large gaps would be expected. The magnitude of the energy gap anisotropy is not presently well-defined, but indications are that the gap differs by a factor of two or more between a basal plane of the superconducting material and a direction orthogonal to the basal plane. By example, the anisotropy of $Y_1Ba_2Cu_3O_{7-x}$ is discussed in the following articles: Phys. Rev. Lett. Vol. 58, No. 25, pp. Lett. Vol. 59, No. 10, pp. 1160-1163, T. K. Worthington et al., 7 Sept. 1987; and Physical Review B, Vol. 36, No. 7, pp. 4025-4027, D. E. Farrell et al., 1 Sept. 1987. Gap anisotropy discussion and data is provided by J. Kirtley in an article to be published in Phys. Rev. B and in Int'l. J. Mod. Phys., 1/90.

In a commonly assigned U.S. patent application Ser. No. 07/051,552, filed May 15, 1987, "High Current Conductors and High Field Magnets Using Anisotropic Superconductors" A. Davidson et al. disclose magnets employing anisotropic superconductors.

However, until the invention described herein this observed energy gap anisotropy of high transition temperature oxide superconductors has not been exploited to provide electrical devices having the unique properties described below.

It is thus an object of the invention to provide an electrical device that operates in accordance with an energy gap anisotropy of a superconducting material of which the device is comprised.

It is another object of the invention to provide several thin film structures that operate in accordance with an energy gap anisotropy of a high transition temperature oxide superconductor of which the thin film structures are comprised.

It is a further object of the invention to provide thin film device structures in which an energy gap anisotropy of a high transition temperature oxide superconductor is exploited to control currents in the thin film device structures.

SUMMARY OF THE INVENTION

The foregoing problems are overcome and the objects of the invention are realized by a superconductive switching device formed on a substrate and including, in accordance with the invention, a first or base electrode comprised of a layer or film of anisotropic superconducting material. The material of the base electrode has a first crystalline axis along which a magnitude of an energy gap of the material is less than an energy gap of the material along other crystalline axes. The superconductive switching device further includes at least one injector electrode forming either a planar or an edge tunneling junction with the base electrode for injecting, under the influence of a bias potential eV, quasiparticles into the base electrode. In accordance with the teaching of the invention the first crystalline axis is aligned in a predetermined manner with the tunneling junction for optimizing the quasiparticle injection efficiency of the tunneling junction.

A basal plane of the base electrode is referred to as an a-b plane, the subscripts a, b, and c being used to identify three mutually orthogonal crystalline axes. The material has an energy gap $\Delta$ associated with each axis such that $\Delta_a$ and $\Delta_b$ each greater than $\Delta_c$ by a factor of order 2 and a magnitude of the bias voltage (eV) is chosen so that $\Delta_c + \Delta_i < eV < \Delta_a + \Delta_i$, where $\Delta_i$ is an energy gap of the injector electrode. For an injector electrode comprised of a normal material $\Delta_i$ is zero.

BRIEF DESCRIPTION OF THE DRAWING

The above-set forth and other features of the invention are made more apparent in the ensuing Detailed Description of the Invention when read in conjunction with the attached Drawing, wherein:

FIG. 5b is an I-V curve illustrating the I-V characteristics of each of the two edge tunneling junctions of FIG. 5a;

FIG. 5c is a cross-sectional view of one of the edge tunneling junctions of FIG. 5a.

DETAILED DESCRIPTION OF THE INVENTION

The invention discloses several embodiments of thin film non-equilibrium device structures based upon an energy gap anisotropy of a superconductor, particularly a high transition temperature oxide superconductor. In accordance with the invention the energy gap anisotropy is employed to control an electrical current in the thin film device. The specific structures disclosed are employed for novel devices and are also employed to improve the operation of known types of devices.

Figure 1A:
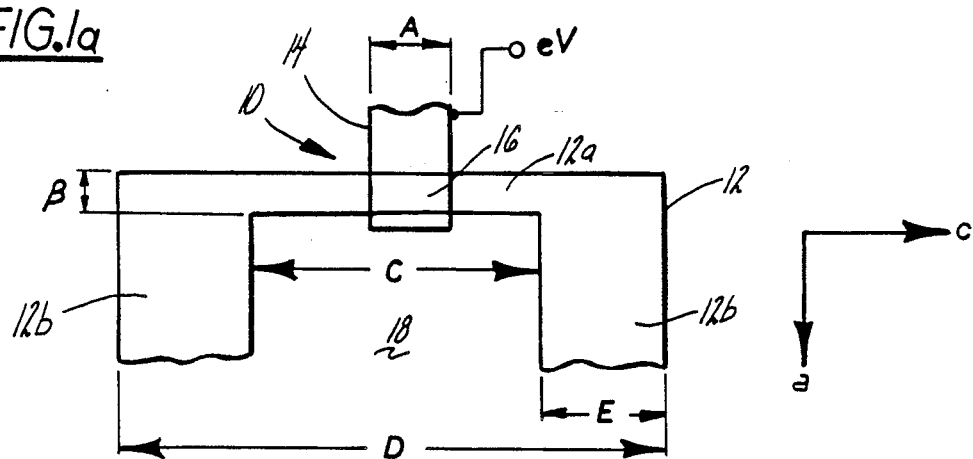
FIG. 1a is a top, enlarged view of a first embodiment of a thin film device including a base film comprised of high $T_c$ superconductor material and an overlying injector film comprised of a normal or of a high $T_c$ superconductor material.

Referring to FIG. 1a there is illustrated a top, enlarged view of a first embodiment of a thin film non-equilibrium device 10. Device 10 includes a planar tunnel junction 16 formed between a base film 12 and an injector film 14. The base film 12 can be seen to be differentiated into a relatively narrow bridge or link 12a connecting two wider regions referred to as banks 12b. Representative dimensions of the device 10 are an A dimension within a range of approximately 0.5 microns to approximately 5.0 microns, a B dimension within a range of approximately 1.0 microns to approximately 3.0 microns, a C dimension of approximately 10 microns or less, a D dimension within a range of approximately 2.0 microns to approximately 10 microns and an E dimension within a range of approximately 0.5 microns to approximately 2.0 microns. As can be seen, the C dimension is equal to D-2E. The thickness of the high $T_c$ superconductor material of base film 12 is within a range of approximately 100 Angstroms to approximately 1000 Angstroms. A thin tunnel barrier having a thickness within a range of approximately 10 Angstroms to approximately 100 Angstroms is provided between the base and injector films 12 and 14 at least in the junction 16 region. Typically the tunnel barrier is provided as a relatively thin layer of oxide although a layer of $BaF_2$ is also a suitable material. The device 10 may be operated as an injection weak link device of the type described in the before mentioned commonly assigned U.S. Pat. No. 4,831,421, issued May 16, 1989, "Superconducting Device", W. J. Gallagher and S. I. Raider. In accordance with one embodiment of the invention at least base film 12 is comprised of a thin layer of an anisotropic high $T_c$ oxide superconductor, for example $La_{1-x}Sr_xCuO_4$, $Eu_1Ba_2Cu_3O_{7-y}$ or $Y_1Ba_2Cu_3O_{7-x}$, in which the basal planes of base film 12 are caused to be aligned normal to a plane of an underlying substrate 18. Injector film 14 may be a normal material or may also be a high $T_c$ superconductor. Base film 12 is formed by a thin film growth technique that produces a single-crystal or at least an oriented polycrystalline film upon a suitable substrate 18 material such as MgO or $SrTiO_3$. It is assumed that the tunnel junction 16 is formed between the base film 12 and the injector film 14.

High $T_c$ superconductors of many forms have been prepared by a variety of techniques, including standard ceramic processing of oxide, carbonate, nitrate, powders, etc. to form bulk materials, vapor transport for depositing thin films, and plasma spray coating. By example, a commonly assigned U.S. patent application Ser. No. 027,584, of P. Chaudhari et al. filed Mar. 18, 1987 describes a technique for producing thin films of high $T_c$ superconductors.

Further in this regard in a journal article entitled "Epitaxy and Orientation of $Eu_1Ba_2Cu_3O_{7-y}$ Films Grown In Situ by Magnetron Sputtering", Japanese Journal of Applied Physics, Vol. 28, No. 6, June, 1989, pp. 981–983, Hidefumi Asano, Masayoshi Asahi and Osamu Michikami describe the in-situ growth of superconducting films of $Eu_1Ba_2Cu_3O_{7-y}$ onto $SrTiO_3$ and MgO (100) substrates by magnetron sputtering from a stoichiometric oxide target. The sputtering process is said to result in the growth of epitaxial films with perfect a-axis orientation as well as perfect c-axis orientation. The orientation of the films is said to be controlled by proper choices of substrate temperature, oxygen pressure, and film growth rate.

In the ensuing description the following notation is employed: the basal plane is referred to as an a-b plane and the subscripts a, b, and c are used to identify the orientation of the crystalline axes. It is assumed that the energy gaps are such that $\Delta_a$ and $\Delta_b$ are greater than $\Delta_c$ by a factor of order 2.

Using the notation outlined above a thin linear structure or link 12a is formed, such as by magnetron sputtering, having a width of B and a length of C. A long axis of the link 12a is formed such that it is aligned with the c-axis, or low energy gap, direction of the anisotropic high $T_c$ superconductor material. The tunnel junction 16, with either a superconducting or a normal counterelectrode (injector film 14), is biased and injects quasiparticles into the underlying superconducting base film 12, particularly into the link 12a. The magnitude of the bias voltage (eV) is chosen so that $$\Delta_c + \Delta_i < eV < \Delta_a + \Delta_i, \tag{1}$$

where $\Delta_c$ and $\Delta_a$ are the values of the energy gaps along the c-axis and the a-axis, respectively, and where $\Delta_i$ is the energy gap of the superconducting injector film 16. If the injector film is comprised of a normal material $\Delta_i$ is zero and the expression reduces to $\Delta_c < eV < \Delta_a$. A typical value for eV is within a range of approximately 10 millivolts to approximately 100 millivolts. The overall effect of the operation of the injector film 14 is to switch the underlying high $T_c$ superconductor material between the normal and the superconducting state.

In the thin film device 10 of the invention the injected quasiparticles diffuse in the c-axis direction. However, due to the anisotropy of the high $T_c$ material and the alignment of the film axes the larger energy gap in the a-axis direction means that there are no allowed quasiparticle states in that direction. In the superconducting state the current flowing along the link 12a is carried by pairs. On injection via the junction 16 quasiparticles enter the superconducting strip and diffuse away from the injection region. These quasiparticles are confined to the link 12a and cannot diffuse into the superconducting banks 12b because their energy is smaller than the magnitude of the energy gap in the a-direction. It is only through Andreev scattering, that is the conversion of quasiparticles to pairs, that quasiparticles can enter the banks 12b at all. The net result is the confinement of the non-equilibrium quasiparticle distribution to the link 12a region, greatly increasing the injection efficiency of the device 10. The link 12a is thus easily driven into the normal state, in which case it develops a significant resistance due to the large resistivity of the high temperature superconducting material and the narrow linear geometry of the link 12a.

In non-equilibrium switching devices of this type the link 12a length is preferably kept short in order to allow fast switching. In previously known devices the operation of such short-link devices was impaired because significant numbers of injected quasiparticles diffused out of the injector electrode region and into the banks. During operation the banks are preferably only minimally perturbed. This diffusion reduces the quasiparticle density in the link, and a higher injection current is thus required in order to drive the link normal. That is, in conventional short-link devices the injection efficiency is reduced. However, by confining the injected quasiparticles to the link 12a itself the device 10 of the invention exhibits improved injection efficiency over the devices of the prior art, resulting in higher device gain.

Another important feature of this structure made possible by the teaching of the invention is that the resulting continuity of material in the device 10 causes non-equilibrium phonons to not be confined to the link region. That is, the phonon trapping effect, which is known to limit device turn-off time, is reduced. Furthermore, the phonon trapping effect may be reduced to essentially zero by using as a substrate or underlayer a film of essentially identical material to that of the overlying high $T_c$ film. The underlayer material has subtle position change or damage made therein to make the underlayer insulating. As a result of the excellent acoustic match between the underlayer and the superconductor this technique can be used to virtually eliminate phonon trapping. An overlayer can be similarly employed. One suitable technique for modifying the underlayer to achieve this effect is to provide an oxygen-deficient form of $YBa_2Cu_3O_7$ as the substrate or underlayer and to provide a $YBa_2Cu_3O_7$ superconducting thin film thereon.

Figure 2:
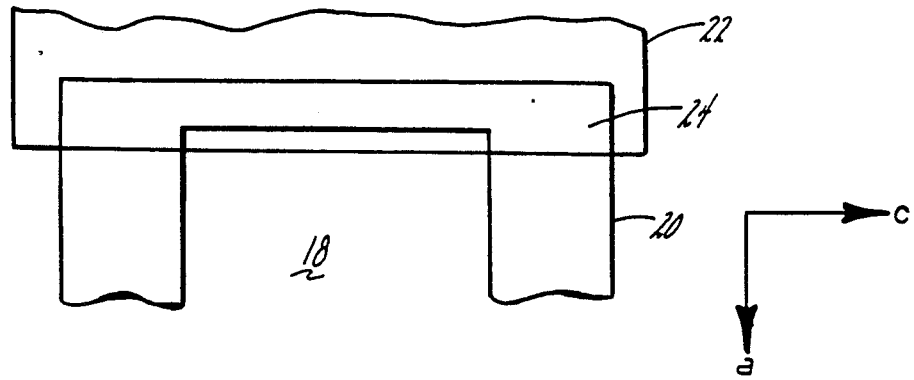
FIG. 2 is a top, enlarged view of a second embodiment of a thin film device including a base film comprised of high $T_c$ superconductor material.

FIG. 2 shows an alternative structure for the injector junction which is self-aligned, thereby reducing alignment tolerance requirements. In the embodiment of FIG. 2 a base film forming a superconducting link structure 20 is disposed beneath an overlying normal or superconducting counterelectrode 22 and separated therefrom by a layer of tunneling oxide for forming a planar junction 24 that extends over the entire link region. The orientation of the c-axis of the superconducting film of the structure 20 is as is shown in FIG. 1a. That is, the basal planes of the base film are disposed normal to the substrate 18 and the c-axis is aligned with a long axis of the link region of reduced base electrode width. The voltage in the tunnel junction is chosen to be between the two gap values, as expressed in Equation (1) above, and only minimal injection of quasiparticles with momenta in the large gap direction occurs. Thus, a significant increase of quasiparticle density is confined to the link region underlying the counterelectrode 22, as in the first embodiment (FIG. 1a).

Figure 1B:
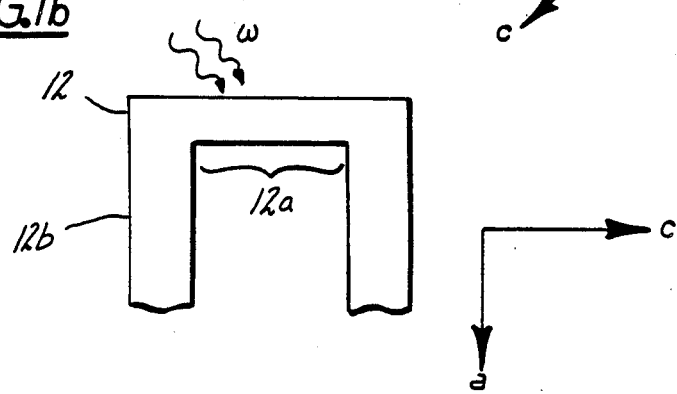
FIG. 1b is a top, enlarged view of an embodiment wherein quasiparticles are provided by absorbed radiation.

It should be noted that base film geometries similar to those of FIGS. 1a and 2 can also be employed without the overlying tunnel injector. Referring to FIG. 1b the base film 12 absorbs incident radiation and the link 12a region is perturbed by photon absorption. Photons with energy in excess of the energy gap break pairs, causing an increase in quasiparticle density. In accordance with the invention only quasiparticles with momenta in the c-axis direction are produced if $2\Delta_c < n_\omega 2\Delta_a$, where n is Plank's constant and $\omega$ is the wavelength of the incident radiation. Alternatively, the superconducting film of the link 12a region could be perturbed using a magnetic field, again with directional effects.

Figure 3:
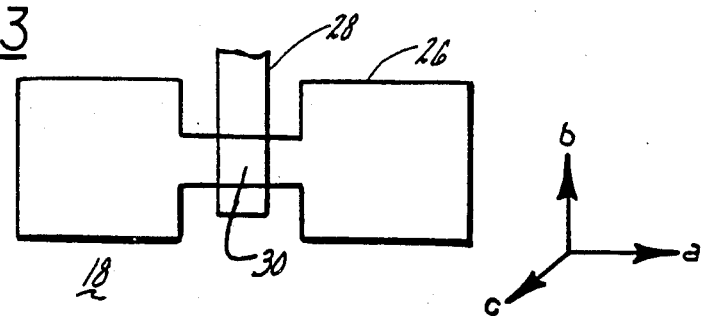
FIG. 3 is a top, enlarged view of a third embodiment of a thin film device including a base film comprised of high $T_c$ superconductor material making a planar tunneling junction with an overlying injector film.
Figure 4:
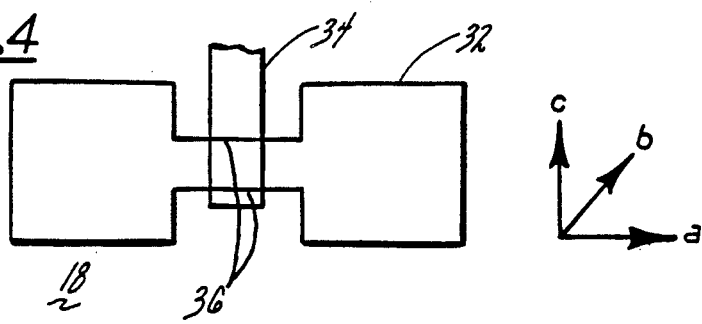
FIG. 4 is a top, enlarged view of a fourth embodiment of a thin film device including a base film comprised of high $T_c$ superconductor material making two edge tunneling junctions with an overlying injector film.

Other weak link embodiments of the invention are illustrated in FIGS. 3 and 4. In FIG. 3 a superconducting base film 26 is deposited upon the substrate 18 such that the small energy gap c-axis is normal to the plane of the substrate 18. A normal or superconducting injector film or counterelectrode 28 is separated from the base film 26 by a tunneling barrier and forms a planar junction 30. Current flows in a large gap (a,b) direction and tunnel injection occurs in the small gap (c) direction. In FIG. 4 a superconducting base film 32 is deposited upon the substrate 18 such that the small gap (c) axis is in the plane of the substrate 18 and parallel to a long axis of the injector film 34. Injector film 34 is separated from the base film 32 by a tunnel barrier and forms two edge junctions 36. Current flows in a large gap (a,b) direction and tunnel injection occurs in the small gap (c) direction. In accordance with the invention the use of the small gap c-axis direction for quasiparticle injection means that less injector current is required to drive the link to a normal state.

In the cases illustrated in FIGS. 3 and 4 the excess quasiparticle density due to injection depresses the energy gap in all crystal directions even though the injection energy is only sufficient to break pairs having gaps smaller than the ab-plane gap value. This is because the quasiparticle density and the energy gap are related in a way which couples the various crystal directions. Thus, adding quasiparticles with momenta in one direction depresses the energy gap in all directions. Were this not the case, it would be possible to have normal conductivity in one direction and superconductivity in other directions, a situation which has not been observed.

Figure 5A:
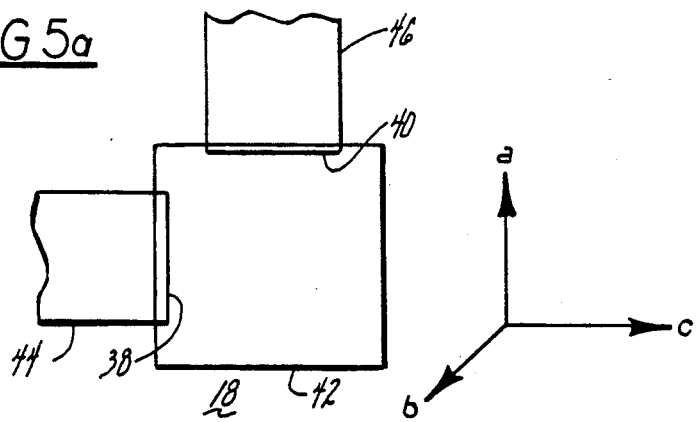
FIG. 5a is a top, enlarged view of a fifth embodiment of a thin film device including a base film comprised of high $T_c$ superconductor material forming two double edge tunneling junctions, one to each of two overlying injector films.
Figure 5B:
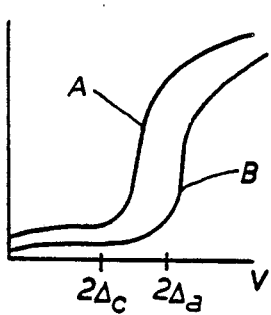

FIG. 5a illustrates a double tunnel junction structure in which the electrodes are anisotropic superconducting films. Two edge junctions 38 and 40 share a common superconducting base electrode 42. For simplicity, the case is considered in which the crystal orientation is the same in the base film 42 and also in the first injector film 44 and in the second injector film 46. In the structure of FIG. 5a, the films are oriented so that the basal planes are normal to the substrate 18. Thus, $\Delta_a > \Delta_c$. In that the junctions 38 and 40 are edge junctions the I-V characteristics are as shown in FIG. 5b wherein the curve labeled "A" is associated with the junction 38 and the curve labeled "B" is associated with the junction 40. The two current-voltage characteristics relate to tunnel junctions in which tunneling occurs in the c-axis, or small gap, direction (curve A) and in the a-axis, or large gap, direction (curve B). A sharp rise in the junction current occurs when the bias voltage exceeds twice the relevant energy gap, $2\Delta_c$ in curve A and $2\Delta_a$ in curve B.

Figure 5C:
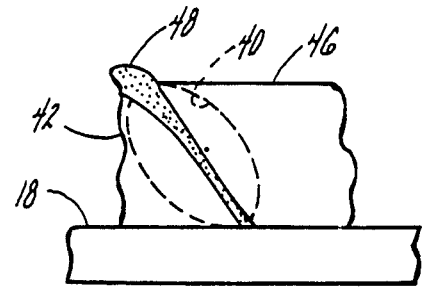

FIG. 5c illustrates in cross-section a portion of the device of FIG. 5a to more clearly show the edge junction 40 as a region, shown in dotted outline, formed between the injector film 46 and a sloping edge of the base film 42. The edge of the base film 42 typically has a slope in the range of 30° to 60°. A thin tunnel barrier 48 is interposed between the base film 42 and the injector film 46.

Figure 6:
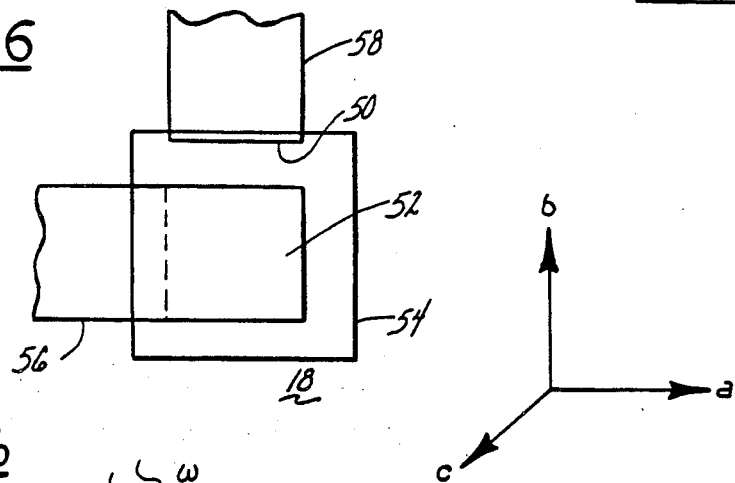
FIG. 6 is a top, enlarged view of a sixth embodiment of a thin film device including a base film comprised of high $T_c$ superconductor material forming one edge tunneling junction and one planar junction with two overlying injector films.

FIG. 6 illustrates a similar double tunnel junction structure in which the electrodes are anisotropic superconducting films. One edge junction 50 and one planar junction 52 share a common superconducting base electrode 54, the planar junction 52 sampling the small gap (c) direction aligned normal to the substrate 18. Again for simplicity, the case is considered in which the crystal orientation is the same in the base film 54 and also in a first injector film 56 and in a second injector film 58. In the structure of FIG. 6 the films are oriented so that the basal planes are parallel to the substrate 18.

In both of the structures of FIGS. 5a and 6 the base electrode film has dimensions of order of a quasiparticle diffusion length, or approximately several thousand Angstroms. When the small gap (c) junction is biased such that that $2 \Delta_c < eV < 2 \Delta_a$ then injection of non-equilibrium quasiparticles into the base electrode film occurs. The energy gap(s) in the film are related in self-consistent fashion to the quasiparticle density so that both large and small gaps are reduced even though the injected quasiparticles do not have sufficient energy to propagate as quasiparticles in the a-axis direction of the unperturbed film. The structures may be employed in non-equilibrium type devices.

In accordance with the invention the structures exhibit unique properties in that injection at a voltage less that $2 \Delta_a$ can be used to reduce $\Delta_a$ to zero. Thus voltage gain is available. In addition, there is provided isolation between the two injector electrodes in the sense that application of the same voltage to the large gap junction, instead of the small gap (c) junction, does not produce significant quasiparticle injection. Of course the critical current densities of the two junctions can be chosen independently. Furthermore, the use of normal metal films for the injector electrodes, operating at a temperature well below the critical temperature of the superconductor, also causes the I-V characteristic of the device to be distinctly nonlinear.

Also, it is believed that a large gap anisotropy should also be obtainable in other materials, most notably artificially-layered superlattices. As a result, the teaching of the invention is not to be construed to be limited to only single or nominally polycrystalline films. Furthermore, the invention is not intended to be limited to only high transition temperature superconducting material but is also applicable to low transition temperature superconducting material that exhibits anisotropic behavior. In addition there is no intent to limit the practice of the invention to only those high transition temperature superconducting compounds expressly mentioned herein.

Thus, while the invention has been particularly shown and described with respect to preferred embodiments thereof, it will be understood by those skilled in the art that changes in form and details may be made therein without departing from the scope and spirit of the invention.

Having thus described our invention, what we claim as new, and desire to secure by Letters Patent is:

1. A superconductive switching device formed on a substrate comprising:

first electrode means comprised of a layer of anisotropic superconducting material having a first axis along which a magnitude of an energy gap of the material is less than an energy gap of the material along other axis of the material; and at least one injector electrode means forming a tunneling junction with said first electrode means for injecting, under the influence of a bias potential eV, quasiparticles into said first electrode means, wherein the first axis is aligned in a predetermined manner with the tunneling junction for optimizing a quasiparticle injection efficiency of the tunneling junction.

2. A superconductive switching device as set forth in claim 1 wherein the tunneling junction is a planar junction.

3. A superconductive switching device as set forth in claim 1 wherein the tunneling junction is an edge junction.

4. A superconductive switching device as set forth in claim 1 and including a second injector electrode means forming a second tunneling junction with the first electrode means.

5. A superconductive switching device as set forth in claim 4 wherein both of the tunneling junctions are edge junctions.

6. A superconductive switching device as set forth in claim 4 wherein one of the tunneling junctions is an edge junction and wherein the other one of the tunneling junctions is a planar junction.

7. A superconductive switching device as set forth in claim 1 wherein said at least one injector electrode means forms a tunneling junction with said first electrode means at a portion of said first electrode means having a reduced width relative to other portions of said first electrode means.

8. A superconductive switching device as set forth in claim 7 wherein the tunneling junction is a planar junction and wherein the first axis is aligned parallel to a long axis of the portion having a reduced width.

9. A superconductive switching device as set forth in claim 7 wherein said tunneling junction has an area substantially equal to an entire area associated with the portion of reduced width.

10. A superconductive switching device as set forth in claim 7 wherein the tunneling junction is a planar junction and wherein the first axis is aligned perpendicular to a plane of the substrate.

11. A superconductive switching device as set forth in claim 7 wherein said at least one injector electrode means forms two edge tunneling junctions with said first electrode means at a portion of said first electrode means having a reduced width relative to other portions of said first electrode means.

12. A superconductive switching device as set forth in claim 1 wherein at least the first electrode means is comprised of a layer of an anisotropic high transition temperature superconductor in which a basal plane of the layer is aligned normal to a plane of the substrate.

13. A superconductive switching device as set forth in claim 1 wherein at least the first electrode means is comprised of a layer of an anisotropic high transition temperature superconductor in which a basal plane of the layer is aligned parallel to a plane of the substrate.

14. A superconductive switching device as set forth in claim 1 wherein a basal plane of the first electrode means is referred to as an a-b plane, wherein the subscripts a, b, and c are used to identify three mutually orthogonal crystalline axes, wherein the material has an energy gap $\Delta$ associated with each axis such that $\Delta_a$ and $\Delta_b$ are each greater than $\Delta_c$ by a factor of order 2, and wherein a magnitude of eV is chosen so that $$\Delta_c + \Delta_i < eV < \Delta_a + \Delta_i,$$

where $\Delta_i$ is an energy gap of the injector electrode means.

15. A superconductive switching device formed on a substrate comprising:
   first electrode means formed on the substrate and comprised of a layer of anisotropic superconducting material having a first crystalline axis along which a magnitude of an energy gap of the material is less than an energy gap of the material along other crystalline axes; and
   means, coupled to the first electrode means, for inducing the presence of quasiparticles within said first electrode means, wherein the first crystalline axis is orientated in a predetermined manner with a plane of the substrate for improving an efficiency of quasiparticle inducement within said first electrode means relative to other orientations of the first crystalline axis with respect to the substrate.

16. A superconductive switching device as set forth in claim 15 wherein the inducing means is comprised of at least one injector electrode means forming a planar or an edge tunneling junction with said first electrode means for injecting, under the influence of a bias potential eV, quasiparticles into said first electrode means.

17. A superconductive switching device as set forth in claim 15 wherein the inducing means is comprised of incident electromagnetic radiation, wherein quasiparticles with momenta in the direction of the first crystalline axis are produced for radiation having energy such that $2\Delta_c < n\omega < 2\Delta_a$, where n is Plank's constant, where $\omega$ is the wavelength of the incident radiation, wherein $\Delta_c$ is the energy gap of the anisotropic superconducting material along the first crystalline axis, and wherein $\Delta_a$ is the energy gap of the anisotropic superconducting material along a second crystalline axis that is orthogonally disposed with respect to the first crystalline axis.

18. A superconductive switching device as set forth in claim 15 wherein the inducing means is comprised of a magnetic field.

19. A superconductive switching device as set forth in claim 15 wherein the substrate is comprised of a material similar in composition to the anisotropic superconducting material for significantly reducing a detrimental effect of phonon trapping on a switching speed of the device.

20. A superconductive switching device as set forth in claim 19 wherein the substrate is comprised of an oxygen-deficient form of $YBa_2Cu_3O_7$ and wherein the anisotropic superconducting material is comprised of $YBa_2Cu_3O_7$.

21. An electrical device formed on a substrate and comprising:
   first electrode means formed on the substrate and comprised of a layer of anisotropic material having a first crystalline axis along which a magnitude of an energy gap of the material is less than an energy gap of the material along other crystalline axes; and
   means, coupled to the first electrode means, for inducing the presence of quasiparticles within said first electrode means, wherein the first crystalline axis is orientated in a predetermined manner with a plane of the substrate for improving an efficiency of quasiparticle inducement within said first electrode means relative to other orientations of the first crystalline axis with respect to the substrate.

22. An electrical device as set forth in claim 21 wherein the inducing means is comprised of at least one injector electrode means forming a planar or an edge tunneling junction with said first electrode means for injecting, under the influence of a bias potential, quasiparticles into said first electrode means.

23. An electrical device as set forth in claim 21 wherein the first electrode means is comprised of a layer of an anisotropic superconducting material in which a basal plane of the layer is aligned normal to a plane of the substrate.

24. An electrical device as set forth in claim 21 wherein the first electrode means is comprised of a layer of an anisotropic superconducting material in which a basal plane of the layer is aligned parallel to a plane of the substrate.

* * * * *

UNITED STATES PATENT AND TRADEMARK OFFICE
CERTIFICATE OF CORRECTION

PATENT NO. : 5,101,243
DATED : March 31, 1992
INVENTOR(S) : Chi et al.

It is certified that error appears in the above-identified patent and that said Letters Patent is hereby corrected as shown below:

In Claim 1, column 8, line 17, please delete "axes" and replace same with --axis--.

In Claim 17, column 9, line 49, please delete both occurences of "n" and replace same with --ñ--.

Signed and Sealed this

Fifteenth Day of June, 1993

Attest:

MICHAEL K. KIRK

Attesting Officer

Acting Commissioner of Patents and Trademarks